United States Patent
Phillips

(10) Patent No.: US 8,851,386 B2
(45) Date of Patent: Oct. 7, 2014

(54) REMOVABLY SECURING SMALL CONTACTLESS PAYMENT CARD VIA REMOVABLE ACCESSORY TO ELECTRONIC DEVICE

(75) Inventor: Simon Phillips, York (GB)

(73) Assignee: MasterCard International Incorporated, Purchase, NY (US)

( * ) Notice: Subject to any disclaimer, the term of this patent is extended or adjusted under 35 U.S.C. 154(b) by 1161 days.

(21) Appl. No.: 12/356,367

(22) Filed: Jan. 20, 2009

(65) Prior Publication Data

US 2010/0182764 A1    Jul. 22, 2010

(51) Int. Cl.
  G08B 13/14  (2006.01)
  H05K 9/00  (2006.01)
  G06K 19/073  (2006.01)
  H04M 1/02  (2006.01)

(52) U.S. Cl.
  CPC .......... *H05K 9/002* (2013.01); *G06K 19/07318* (2013.01); *G06K 19/07309* (2013.01); *G06K 19/07327* (2013.01); *H04M 1/0202* (2013.01)
  USPC ..... 235/492; 235/451; 340/572.1; 340/572.3; 340/572.8; 340/572.9; 206/38

(58) Field of Classification Search
  CPC .................. G06K 19/07771; G06K 19/07327; G06K 19/07318; G06K 19/07749; G06K 7/10336
  USPC ....................................................... 235/492
  See application file for complete search history.

(56) References Cited

U.S. PATENT DOCUMENTS

| | | | |
|---|---|---|---|
| 6,121,544 A * | 9/2000 | Petsinger | 174/353 |
| 6,142,369 A | 11/2000 | Jonstromer | |
| 6,863,220 B2 | 3/2005 | Selker | |
| 7,719,425 B2 * | 5/2010 | Colby | 340/572.8 |
| 7,865,214 B2 * | 1/2011 | Kushima | 455/562.1 |
| 2002/0183094 A1 * | 12/2002 | Seita | 455/558 |
| 2004/0019564 A1 | 1/2004 | Goldthwaite et al. | |
| 2010/0093412 A1 * | 4/2010 | Serra et al. | 455/575.8 |

FOREIGN PATENT DOCUMENTS

| | | | | |
|---|---|---|---|---|
| JP | 2001-67442 | * | 3/2001 | ............. G06K 19/00 |
| WO | 99/66752 A1 | | 12/1999 | |
| WO | WO 2008018413 A1 | * | 2/2008 | |

OTHER PUBLICATIONS

English Translation of JP 2001-67442; machine translated.*
Sato, K., English translation of JP 2001-67442, Mar. 2001.*

* cited by examiner

*Primary Examiner* — Christopher Stanford
(74) *Attorney, Agent, or Firm* — Buckley, Maschoff & Talwalkar LLC

(57) ABSTRACT

An apparatus includes a portable electronic device and an article of manufacture. The article of manufacture includes a first mechanism for securing the article of manufacture to the portable electronic device. The article of manufacture also includes a second mechanism for defining a slot. The second mechanism is coupled to the first mechanism. The slot is shaped and sized to receive and securely hold a contactless integrated (IC) identification card. The card in question has no more than half of the planar extent defined for a standard ID-1 identification card.

10 Claims, 7 Drawing Sheets

REMOVABLY SECURING SMALL CONTACTLESS PAYMENT CARD VIA REMOVABLE ACCESSORY TO ELECTRONIC DEVICE

BACKGROUND

It is well known to provide contactless payment cards in the standard ID-1 geometry (substantially 85.6×54 mm in planar extent). Such cards resemble conventional credit and debit cards in size and shape, and allow account holders to access debit or credit card accounts to pay for transactions by wireless communication between the contactless payment cards and proximity readers included in point of sale (POS) terminals.

Because of the wireless communication capability of these cards, it is feasible to enhance their convenience by shrinking their size, to perhaps one-half or one-third or less of the planar extent of the standard ID-1 geometry. In this reduced size, a contactless payment card may be carried as a fob on a key ring.

According to certain prior art proposals, it has been suggested that small contactless payment cards be integrated with handheld electronic devices such as mobile telephones. In one such proposal, the housing of a mobile telephone is configured to include one or more slots shaped and sized to receive small contactless payment cards. However, this approach requires coordination and cooperation with manufacturers of mobile telephones and/or with mobile telephone network operators. In practice, it may be difficult to achieve such coordination and cooperation. Also, if a slot or slots of a certain size are included in the mobile telephone housing, small contactless cards of other sizes would not be compatible with the mobile telephone. Still further, there may be significant added cost in modifying the mobile telephone design to accommodate contactless card slots.

In another prior art proposal, an adhesive layer is added to the rear of a contactless payment card, which may take the form of a somewhat flexible self-adhesive label. The card/label can then be adhered to the rear surface of a mobile telephone. One disadvantage with this approach may arise if the account holder wishes to replace the mobile telephone after attaching the payment card/label thereto. It may be difficult to remove the card/label from the mobile telephone housing, and it may be impossible or impractical to attach the card/label to the cardholder's new mobile telephone. Also, if the account holder desires to change payment cards, the problem of removing the card/label from the mobile telephone housing again arises, and such removal may leave an adhesive residue on the mobile telephone housing. Still another disadvantage may arise if the account holder wishes to temporarily lend his/her mobile telephone to another individual, but does not wish to entrust his/her payment card to the individual.

Another possible disadvantage of the latter approach is that the layer of adhesive material on the card/label and/or the flexibility of the card/label may make it difficult to perform personalization processing on the card/label with conventional personalization equipment. Consequently, the cost of personalizing the card/label may be increased.

The present inventor, in a prior application filed Jul. 27, 2007, and assigned application Ser. No. 11/829,165, discloses a holder for a contactless identification card. The holder is in the form of a sticker that may be adhered to a portable electronic device. The holder may include a slot or pouch in which the contactless identification card may be inserted to removably secure the contactless identification card to the electronic device. The disclosure of the '165 prior application is incorporated herein by reference.

In the present document, the present inventor now discloses further techniques and additional articles of manufacture that may be used to removably secure contactless identification cards to electronic devices.

BRIEF DESCRIPTION OF THE DRAWINGS

Features and advantages of some embodiments of the present invention, and the manner in which the same are accomplished, will become more readily apparent upon consideration of the following detailed description of the invention taken in conjunction with the accompanying drawings, which illustrate preferred and exemplary embodiments and which are not necessarily drawn to scale, wherein.

DETAILED DESCRIPTION

In general, and for the purpose of introducing concepts of embodiments of the present invention, a removable retrofit or accessory may be attached to a handheld electronic device like a mobile telephone. The retrofit or accessory may include a slot that is shaped or sized to hold a small contactless identification card. The retrofit or accessory may be, for example, a protective case in which the device is inserted or an alternative configuration of a battery pack cover. The contactless identification card may be inserted into the retrofit or accessory to secure the contactless identification card to the electronic device. The card may be readily removed from the retrofit or accessory, to be similarly secured to another device, and/or to be replaced by another card. The retrofit or accessory may also be separated as desired from the electronic device. In some applications, the contactless identification card may be a contactless payment card.

In some embodiments, the retrofit or accessory may include a sliding element that is movable by the user between a position in which the sliding element blocks operation of the payment card and a position in which the sliding element permits operation of the payment card. A feature of this type may provide the same benefits that could be achieved by providing an on/off switch on the card itself, but without the added expense and complexity of modifying the card design.

In these or other embodiments, the sliding element may also be configured to selectively hide or reveal information printed on the card.

Figure 1:
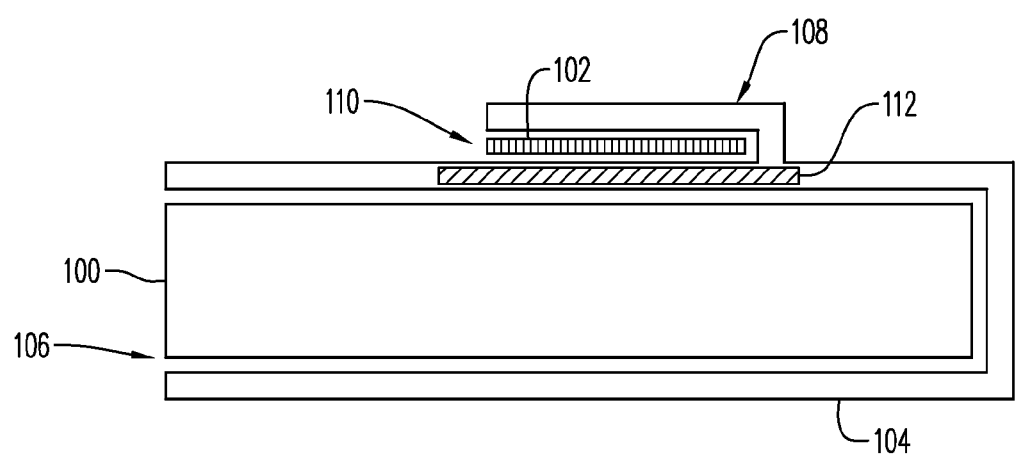
FIG. 1 is a schematic view of a cross-section, taken vertically, of a portable electronic device having a contactless identification card removably secured thereto according to one embodiment of the present invention.

FIG. 1 is a schematic view of a cross-section of a portable electronic device 100 having a contactless identification card 102 removably secured thereto according to one embodiment of the present invention. In some embodiments, the portable electronic device may be a mobile telephone and the contactless identification card may be a payment card. Alternatively, the portable electronic device may be another type of device, such as a portable music player or a PDA (portable digital assistant). The portable electronic device 100 may be entirely conventional. For the most part hereinafter the device 100 will be referred to as "mobile telephone 100".

It is also the case, in some embodiments, that the contactless identification card may identify the individual who holds the card for purposes other than or in addition to payment. For example, the card may be a transit system access card, a retail customer loyalty card, a gym membership card, a building or office suite access card, etc. Again, however, for the most part hereinafter the card 102 will be referred to as "contactless payment card 102".

In accordance with an aspect of the present invention, the mechanism that secures the contactless payment card 102 to the mobile telephone 100 may be an article of manufacture such as a protective carrying case 104 (also referred to as a "protective casing") for the mobile telephone 100. As might be said in common parlance, the protective casing 104 constitutes an accessory for the mobile telephone 100. In some ways the protective casing 104 may be conventional, in that it may be formed largely or entirely of leather or vinyl or the like, or of another flexible material. The protective casing 104 may, for example, generally form a pouch 106 that is shaped and sized to receive the mobile telephone 100. (Although not shown in the drawing, the protective casing 104 may include a flap to close the pouch 106.) It will be appreciated that the pouch 106 may serve as a mechanism that secures the protective casing 104 to the mobile telephone 100 and vice versa. The protective casing 104 may be considered to be "secured" to the mobile telephone 100 even if the two are only somewhat constrained to remain stationary relative to each other as a result of friction between the inner surface of the pouch 106 and the outer surface of the housing (not separately shown) of the mobile telephone 100.

In accordance with aspects of the present invention, the protective casing 104 may include a slot or pocket 108 which is schematically shown in the drawing. The slot is defined by full and/or partial sheets of material from which the protective casing 104 is formed, those sheets of material thus constituting a mechanism for defining the slot 108. The slot 108 is shaped and sized to receive and securely hold the contactless payment card 102. It will be understood that the manner of the contactless payment card 102 being "securely held" in the slot 102 may be a consequence of frictional forces resulting from a fairly snug fit of the contactless payment card 102 inside the slot 108. By the same token, if the user (not shown) were to grip an edge of the contactless payment card 102 at the opening 110 of the slot 108, the user may be able to readily withdraw the contactless payment card 102 from the slot 108.

In some embodiments, the contactless payment card 102 may be substantially smaller, in planar extent, than the dimensions called for by the ID-1 standard. (For the purposes of this disclosure and the appended claims, the "planar extent" of an object refers to the area occupied by the object in the main plane of the object. Thus the "planar extent" of an ID-1 card is substantially 85.6×54 mm.) For example, the planar extent of the contactless payment card 102 may be one-half, one-third, one-quarter or less, or another fraction or percentage, of the planar extent of an ID-1 card. For example, the contactless payment card 102 may have a length that is substantially equal to the width (~54 mm) of an ID-1 card, while having a width that is perhaps one-third to one-fifth the length (~86 mm) of the ID-1 card.

The mobile telephone 100 contains a battery (not separately shown) or other components that may tend to short out the antenna (not separately shown in FIG. 1) of the contactless payment card 102 and thus may tend to interfere with the operation of the contactless payment card 102. To aid in addressing this issue, the protective casing 104 may include a layer 112 of ferrite or other ferromagnetic material. This layer 112 may be referred to as a "shield layer" and may provide the benefit of shielding the contactless payment card 102 from the interfering effects of components of the mobile telephone 100, thereby shielding communications to the contactless payment card 102 from interference from components of the mobile telephone 100. The shield layer 112 may be located adjacent the slot 108 between the slot 108 and the pouch 106. The shield layer 112 may have a planar extent that is somewhat larger than the planar extent of the slot 108 and of the contactless payment card 102 in both the length and width directions of the contactless payment card 102.

Figure 2:
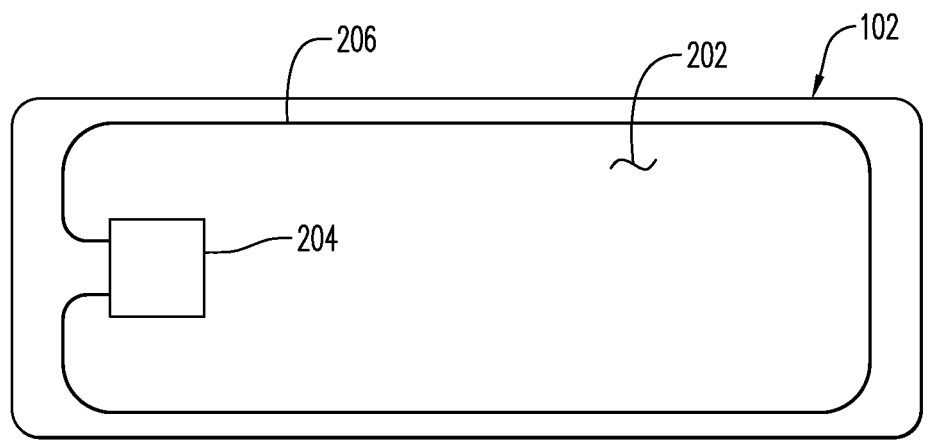
FIG. 2 is a schematic plan view of an example of the contactless identification card seen in FIG. 1.

FIG. 2 is a schematic plan view of an example of the contactless payment card 102 shown in FIG. 1. As seen from FIG. 2, the contactless payment card 102 includes a card-shaped body 202 (e.g., laminated from layers of plastic) in which an RFID (radio frequency identification) chip 204 (IC or integrated circuit) is embedded. An antenna 206 is embedded in the card-shaped body 202 and runs along the periphery of the card-shaped body 202. The antenna 206 is coupled to the RFID chip 204 to allow the RFID chip 204 to receive interrogation signals from proximity reader devices included in POS terminals. The antenna 206 also allows the RFID chip to transmit payment card account information and other information to the POS terminals. The contactless payment card 102 may be constructed and may operate in accordance with conventional practices. For purposes of illustration, the RFID chip and antenna are shown in FIG. 2, but in practical examples of the contactless payment card 102 the card body may be formed largely of opaque plastic and the RFID chip and antenna may be embedded in the opaque plastic so as not to be visible. Instead, the contactless payment card 102 may display branding information such as one or more logos of the issuing bank and of a payment card association, and also may display information—such as account number and account holder's name—that is specific to the particular card.

Reference was made above to the process of "personalizing" the payment card. As is familiar to those who are skilled in the art, during personalization, card specific information is wirelessly written into the card's RFID chip, and may also be printed on the card. In accordance with prior proposals, the process of personalization may be simplified by initially providing the card blank as part of an ID-1 sized assembly that includes scoring or the like to define the card within the ID-1 sized footprint of the assembly. The ID-1 sized assembly may then be processed for purposes of personalizing the card blank using the same standard types of personalization equipment conventionally used to personalize ID-1 sized contactless payment cards.

According to certain prior proposals (e.g., in U.S. Pat. No. 6,863,220), a contactless payment card may include a user-actuatable switch to turn the card on and off. The switch may normally be in an "off" condition, but may be actuated by the user to an "on" condition at the time of presenting the card for reading at a POS terminal. Such a switch may help to prevent certain attacks on the security of the account number stored in the card, by preventing the card from responding to unauthorized interrogation signals. However, it would be preferable not to incur the expense of incorporating a user-actuable switch in payment cards.

Figure 3:
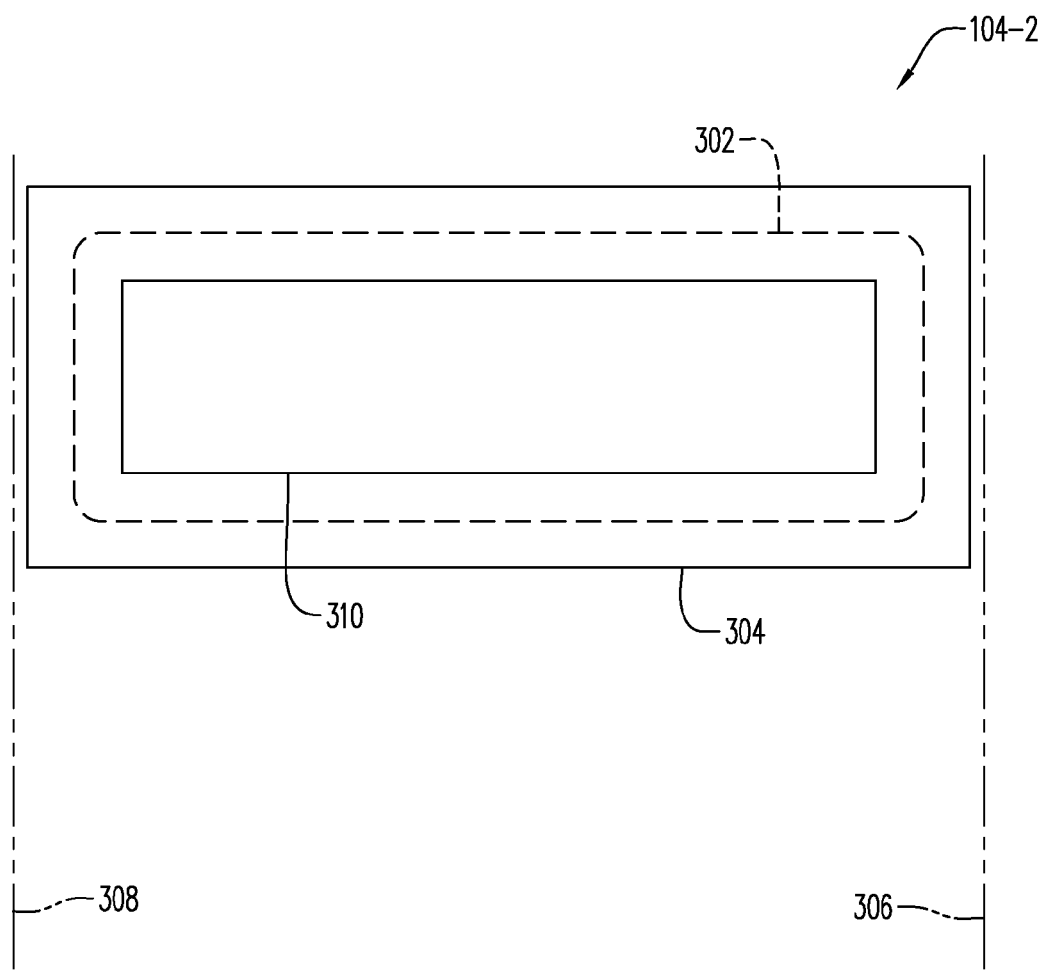
FIG. 3 is a schematic plan view of an aspect of a protective carrying case, as seen in FIG. 1, while the carrying case is in a condition to block operation of a contactless identification card that has been inserted therein.

In accordance with aspects of the present invention, some embodiments of the protective casing 104 may include, in some embodiments, a sliding shield member (not shown in FIG. 1) that can be selectively positioned either to permit interrogation signals to reach the payment card, or to shield the card from interrogation signals. FIG. 3 is a schematic plan view of one such embodiment of a protective casing (indicated generally by reference numeral 104-2 in FIG. 3). FIG. 3 shows the protective casing 104-2 in a condition in which the card is shielded from interrogation signals. The card itself is not explicitly shown, except by a dashed-line rounded rectangle (reference numeral 302), which represents the locus of the card antenna. The protective casing 104-2 is also represented schematically, with the slot for receiving the card not explicitly shown in the drawing. Also, the pouch for holding the portable electronic device is not shown.

Reference numeral 304 indicates a sliding shield member, formed as a hollow rectangle that is proportioned to entirely cover the card antenna 302 when the shield member is suitably positioned, as depicted in FIG. 2. The protective casing 104-2 includes the sliding shield member 304, as well as parallel tracks or guides schematically represented at 306, 308. The sliding shield member 304 is mounted on the tracks 306, 308 so as to allow the sliding shield member 304 to be slidingly moved by the user from the position shown in FIG. 3 to the position shown in FIG. 4. (The tracks may be suitably formed in or on or supported by a sheet of the material from which the protective casing 104-2 is formed, and which at least partially defines the slot 108 which is shown in FIG. 1). Thus the sliding shield member 304 is movable relative to other structures (not shown) of the protective casing 104-2. In the particular embodiment shown in FIGS. 3 and 4, the sliding movement of the sliding shield member 304 is parallel to the plane of the payment card and is transverse (in this case, perpendicular) to the longitudinal axis of the payment card.

When the sliding shield member 304 is in the position shown in FIG. 3, it is directly above the card antenna 302 and serves to block signals from being received by and/or transmitted from the card antenna 302. The sliding shield member 304 may be made of any suitable material, such as a suitable metal foil. When the sliding shield member 304 is in the position shown in FIG. 4, it is offset away from the locus of the card antenna 302, and allows the card antenna to receive and/or transmit signals. The sliding shield member 304 may be directly slidable by being pushed by the user's finger or thumb, or alternatively may be connected to a suitable button, lever, and/or linkage or mechanism (none shown) to allow the user to indirectly actuate sliding motion of the sliding shield member 304.

With a sliding shield member as described herein provided as part of the protective casing, the user may move the sliding shield member to effectively enable and disable operation of the payment card held within the slot, thereby obtaining essentially the same functionality as would be provided by a user-actuatable on/off switch included in the card itself.

Figure 4:
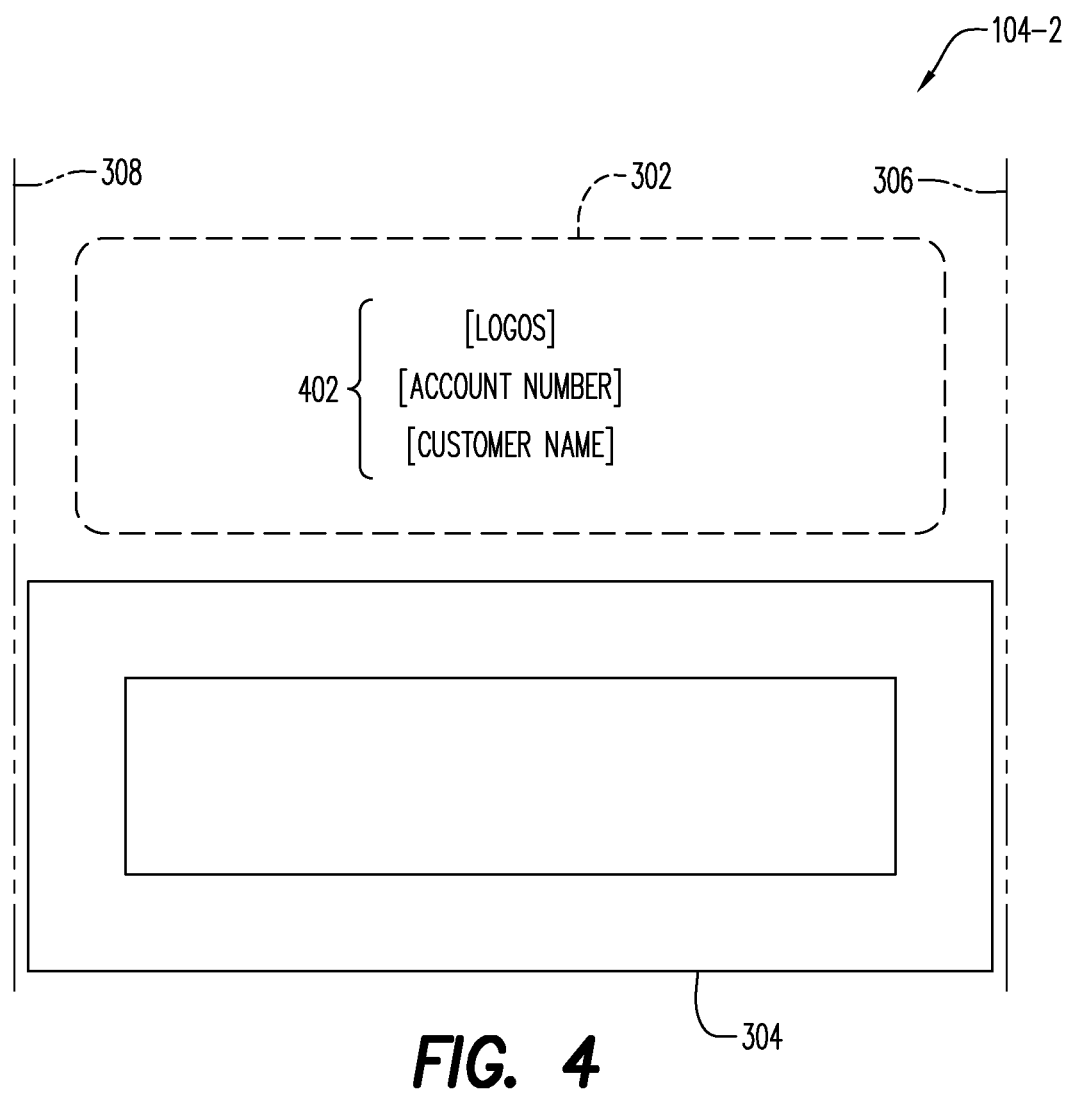
FIG. 4 is a view similar to FIG. 3, showing the carrying case of FIG. 3 in a condition to permit operation of the contactless identification card that has been inserted therein.

In some embodiments, the outer sheet to define the slot may be formed of clear plastic, to allow the user to readily read card-specific information, such as the number of the account accessed via the card, from the card while it is inside the slot. However, for security reasons, it may be desirable that the protective casing normally conceal the account number and/or other information on the card while the card is inside the slot. Accordingly, it may be desirable that the sliding shield member be opaque so that when the sliding shield member is in the position to block the payment card from receiving/transmitting signals, the sliding shield member also conceals any symbols printed on the payment card. Moreover, when the shield member is in the position to permit the payment card to receive/transmit signals, symbols printed on the payment card may be visible. Such an arrangement is schematically illustrated in FIGS. 3 and 4. In FIG. 4, with the sliding shield member 304 in the latter position, symbols schematically indicated at 402 (e.g., branding logos, account number, account holder name) are visible. (It is to be understood that these symbols 402 are printed on the payment card, which is not otherwise depicted in FIG. 4, apart from the antenna 302.) In FIG. 3, with the sliding shield member 304 in the former position, the symbols are concealed. (For example, the sliding shield member 304 may have an inner panel 310 that is formed of opaque plastic. Alternatively, the shield member may be uniformly constructed of, e.g., a suitable metal foil to both block signal receipt/transmission and to conceal symbols printed on the payment card.)

The sliding shield member may be provided in other configurations, as suggested by corresponding disclosure in the above-referenced '165 patent application.

As an alternative to the sliding shield member, a shield member in the form of a flap may be provided. The flap may have a snap arrangement (like a garment snap on a pocket flap) at its free end, to hold the flap/shield member in a closed position over the slot at times when the user does not wish to use the payment card. When the user wishes to enter into a payment transaction, he/she may unsnap the free end of the flap/shield member and flip it away from the slot to allow the payment card to interact with a proximity reader at a POS terminal.

Figure 5:
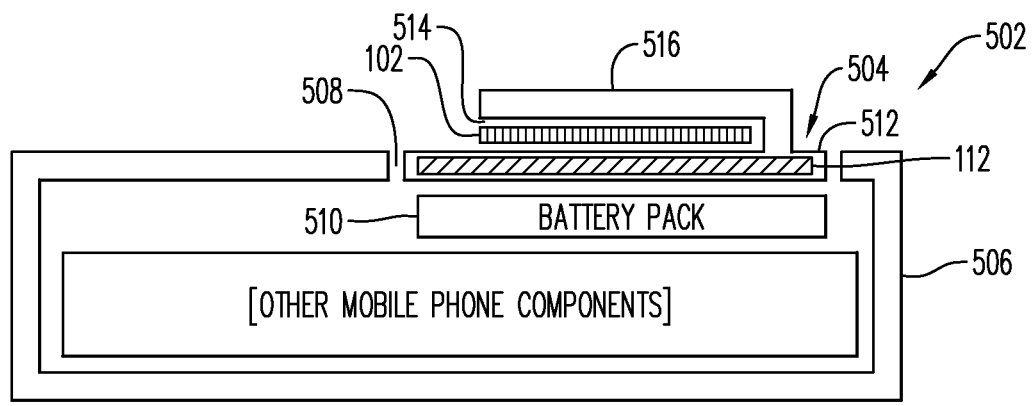
FIG. 5 is a view similar to FIG. 1, showing a portable electronic device having a contactless identification card removably secured thereto according to another embodiment of the present invention.

FIG. 5 is a view similar to FIG. 1, showing a portable electronic device 502 having a contactless payment card 102 removably secured thereto according to another embodiment of the present invention.

The portable electronic device 502, as before, may be a mobile telephone, and may be completely conventional except for a battery pack cover 504 provided in accordance with aspects of the invention as a retrofit in place of a conventional battery pack cover. As will be readily understood, the term "battery pack cover" refers to a panel which closes the housing 506 of the mobile telephone 502 at the locus of a cavity 508 in which a battery pack 510 is installed.

The battery pack cover 504 may be formed primarily of a conventional material for the housing of a portable electronic device, e.g., somewhat rigid metal or molded plastic sheeting. The battery pack cover 504 may include a main panel 512, which has a primary function of closing the opening in the housing 506 at the cavity 508. The main panel 512 of the battery pack cover 504 may also include a shield layer 112 like that described above in connection with FIG. 1. Like any conventional battery pack cover, the main panel 512 may incorporate a mechanism by which the battery pack cover 504 mates with the housing 506 and is thereby removably secured to the mobile telephone 502. This mechanism may, for example, consist in the configuration of the main panel 512 being such that it snap fits onto the housing 506. The battery pack cover 504 may also include a slot 514 defined between the main panel 512 and an outer panel 516. The slot 514 is shaped and sized to receive and securely hold the contactless payment card 102.

Although not shown in the drawing, a sliding shield member as discussed above in connection with FIGS. 3 and 4 may also be included with the battery pack cover 504.

Figure 6:
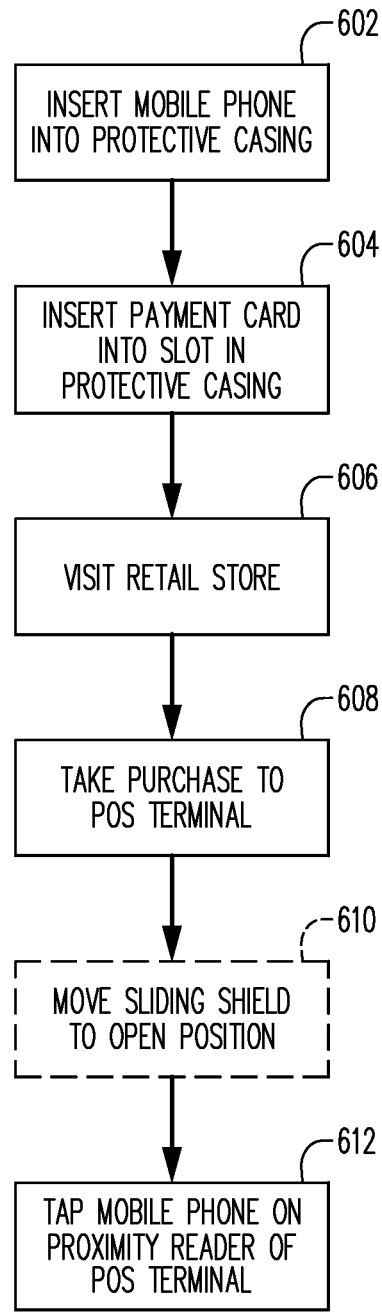
FIG. 6 is a flow chart that illustrates a process that may be performed according to aspects of the present invention.

FIG. 6 is a flow chart that illustrates a process that may be performed according to aspects of the present invention.

At 602 in FIG. 6, the user inserts the mobile telephone 100 (FIG. 1) into the pouch 106 of the protective casing 104. The protective casing may be as described hereinabove in connection with FIG. 1.

At 604, the user inserts a contactless payment card, such as the contactless payment card 102 described above, into the slot 108 in the protective casing that holds the mobile telephone 100. In this way the payment card is removably secured to the mobile telephone, bringing about the condition schematically illustrated in FIG. 1.

At 606, the user takes the mobile telephone, bearing the protective casing and the contactless payment card, with him/her while he/she visits at retail store. At 608, the user makes a selection of merchandise at the store and presents the merchandise for purchase at a POS terminal in the store. After the sales clerk has entered the items to be purchased into the POS terminal (e.g., by scanning barcodes on the merchandise), the user effects payment for the transaction. This may be done, in some embodiments, with a two-step process in which the user (step 610) slides the sliding shield member 304 (if present) into an open position to enable communication with the contactless payment card 102, and (step 612) taps the mobile telephone (e.g., with the payment card side down) on the proximity reader component of the POS terminal. With the payment card thus or otherwise brought into proximity with the reader, wireless communications are exchanged between the payment card and the reader. In this manner, the user's payment card account number is communicated from the contactless payment card to the POS terminal and used to authorize and settle the purchase transaction.

Figure 7:
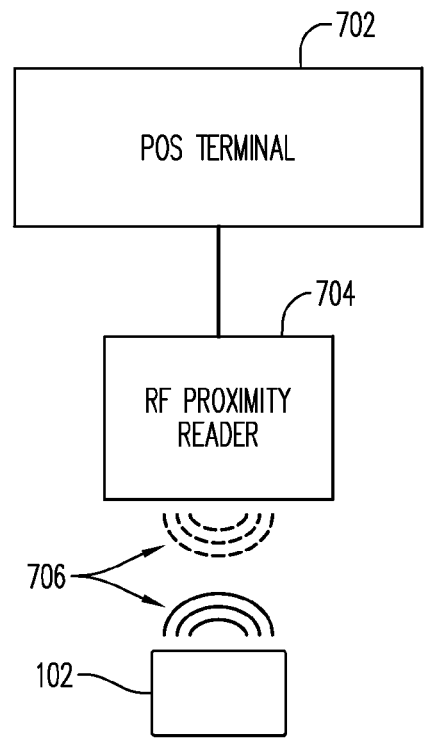
FIG. 7 schematically illustrates some communication aspects of a purchase transaction performed using the mobile telephone/identification card combination of FIG. 1 or 5.

FIG. 7 schematically illustrates some communication aspects of the purchase transaction. The POS terminal is represented at block 702, and block 704 represents the proximity reader interfaced to or incorporated in the POS terminal 702. The contactless payment card is indicated at 102, and the wireless communication between the contactless payment card 102 and the proximity reader 704 is indicated at 706.

Figure 8:
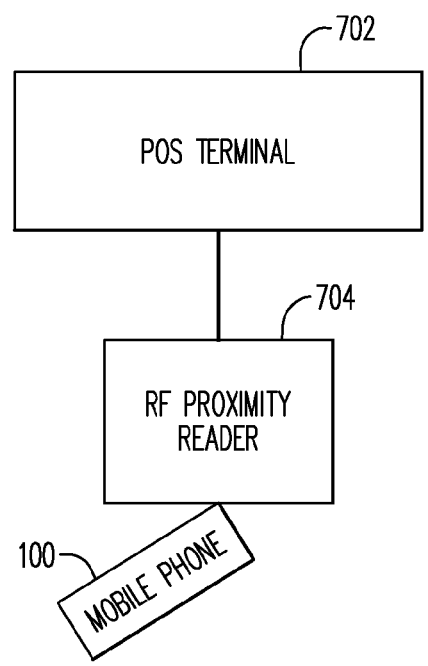
FIG. 8 schematically illustrates some physical aspects of the purchase transaction of FIG. 7.

FIG. 8 schematically illustrates some physical aspects of the purchase transaction. As in FIG. 7, the POS terminal 702 and its associated proximity reader 704 are shown. The mobile phone 100 is also shown in proximity to the proximity reader 704. It is assumed that the mobile phone includes the arrangement of FIG. 1, whereby the protective casing (not separately shown in FIG. 8) has been fitted onto the mobile phone and the contactless payment card (not separately shown in FIG. 8) is secured to the mobile phone by having been inserted into the slot (not shown) of the protective casing. (Alternatively, the mobile phone 100 may encompass the retrofit-plus-payment-card arrangement as shown in FIG. 5.)

Up to this point, the invention has been discussed in terms of contactless payment cards. Alternatively, however, the principles of the invention may be applied to other types of contactless identification cards, such as those used to permit access to a transit system, or those used to identify participants in a customer loyalty system.

The principles of the present invention may also be applied via accessories, retrofits or other accessions to the mobile telephone/portable electronic device beyond those expressly described with respect to FIGS. 1 and 5.

The above descriptions and depictions of processes, including FIG. 6, should not be considered to mandate a fixed order for performing process steps. Rather the steps may be performed in any order that is practicable.

Although the present invention has been described in connection with specific exemplary embodiments, it should be understood that various changes, substitutions, and alterations apparent to those skilled in the art can be made to the disclosed embodiments without departing from the spirit and scope of the invention as set forth in the appended claims.

What is claimed is:

1. An apparatus comprising:
   a portable electronic device; and
   a protective case for the portable electronic device including:
      a pouch for securing the protective case to the portable electronic device;
      a mechanism, coupled to the protective case, for defining a slot, the slot shaped and sized to removably receive and securely hold a contactless integrated circuit (IC) identification card that has no more than half of a planar extent defined for a standard ID-1 identification card;
      a ferrite shield layer having a planar extent slightly larger than a planar extent of the slot, the ferrite shield layer positioned in the protective case adjacent the slot and interposed between the portable electronic device and the contactless IC identification card to shield the contactless IC identification card from interference from components of the portable electronic device; and
      a sliding shield mounted for movement, relative to the slot, between a first position to block signals from being received by and/or transmitted from the antenna of the contactless IC identification card located in the slot, and a second position to allow the antenna of the contactless IC identification card located in the slot to receive and/or transmit signals.

2. The apparatus of claim 1, wherein the portable electronic device is a mobile telephone, a personal digital assistant or a portable music player.

3. The apparatus of claim 1, wherein the sliding shield, when in the first position, is positioned to conceal symbols printed on the contactless IC identification card located in the slot; and said symbols are visible when the card is located in the slot and the sliding shield is in the second position.

4. A protective casing for a portable electronic device, the casing for entirely or partially surrounding a housing of the device, the casing including a pouch shaped and sized to receive the device, the casing further including a slot adjacent the pouch, the slot shaped and sized to removably hold a contactless integrated circuit (IC) identification card that has no more than half of a planar extent defined for a standard ID-1 identification card, a wall of said pouch containing a ferrite shield layer having a planar extent slightly larger than a planar extent of the slot and positioned adjacent said slot, said ferrite shield layer for shielding communications to said IC identification card from interference from components of said portable electronic device, and a sliding shield mounted for movement, relative to the slot, between a first position to block signals from being received by and/or transmitted from the antenna of the contactless IC identification card located in the slot, and a second position to allow the antenna of the contactless IC identification card located in the slot to receive and/or transmit signals.

5. The protective casing of claim 4, wherein the sliding shield, when in the first position, is positioned to conceal symbols printed on the contactless IC identification card located in the slot; and said symbols are visible when the card is located in the slot and the sliding shield is in the second position.

6. An apparatus comprising:
   a portable electronic device;

a card-shaped body;

an integrated circuit (IC) embedded in the card-shaped body;

an antenna embedded in the card-shaped body and coupled to the IC, the antenna for allowing the IC to receive interrogation signals;

a protective casing for the portable electronic device, the casing for entirely or partially surrounding a housing of the portable electronic device, the casing including a pouch shaped and sized to receive the device, the casing further including a slot adjacent the pouch for removably securing the card-shaped body to the portable electronic device;

a ferrite shield layer having a planar extent slightly larger than a planar extent of the slot and interposed between the antenna and the portable electronic device, the ferrite shield layer for shielding communications via the antenna from interference from components of said portable electronic device; and a sliding shield mounted on the protective casing for movement, relative to the slot, between a first position to block signals from being received by and/or transmitted from the antenna in the card-shaped body located in the slot, and a second position to allow the antenna of the card-shaped body located in the slot to receive and/or transmit signals.

7. The apparatus of claim 6, wherein the portable electronic device is a mobile telephone.

8. The apparatus of claim 6, wherein the card-shaped body is part of a contactless payment card.

9. The apparatus of claim 6, wherein the portable electronic device is a personal digital assistant or a portable music player.

10. The apparatus of claim 6, wherein the sliding shield conceals symbols printed on the card-shaped body when in the first position, and wherein the symbols on the card-shaped body are visible when the sliding shield is in the second position.

* * * * *